United States Patent [19]

Rastegar et al.

[11] Patent Number: 5,422,591
[45] Date of Patent: Jun. 6, 1995

[54] OUTPUT DRIVER CIRCUIT WITH BODY BIAS CONTROL FOR MULTIPLE POWER SUPPLY OPERATION

[75] Inventors: Bahador Rastegar, Austin; William C. Slemmer, Dallas, both of Tex.

[73] Assignee: SGS-Thomson Microelectronics, Inc., Carrollton, Tex.

[21] Appl. No.: 176,960

[22] Filed: Jan. 3, 1994

[51] Int. Cl.⁶ .................... H03K 17/04; G05F 1/10
[52] U.S. Cl. .................... 327/409; 327/537; 327/546
[58] Field of Search .......... 307/571, 572, 296.2, 307/473, 475; 327/534, 537, 545, 546, 409

[56] References Cited

U.S. PATENT DOCUMENTS

| | | | |
|---|---|---|---|
| 4,782,250 | 11/1988 | Adams et al. | 307/473 |
| 4,963,766 | 10/1990 | Lundberg | 307/473 |
| 5,160,855 | 11/1992 | Dobberpuhl | 307/296.2 |
| 5,191,244 | 3/1993 | Runaldue et al. | 307/443 |

*Primary Examiner*—Timothy P. Callahan
*Assistant Examiner*—Terry L. Englund
*Attorney, Agent, or Firm*—Kenneth C. Hill; Lisa K. Jorgenson; Richard K. Robinson

[57] ABSTRACT

A push-pull output driver including two transistors in series, one transistor having its body bias controlled by logic circuitry commanded by the driver input. The driver has a pair of transistors in series, the transistor inputs being complementary to create a push-pull amplifier. A switching transistor is controlled by the inverse of the driver input signal and acts as a switch at the pull-up transistor well-tie. When the driver input is high, the switching transistor is off allowing the well-tie to the pull-up transistor to be connected to the driver output. When the input is low, the switching transistor turns on, switching the well-tie of the pull-up transistor to ground. By controlling the body bias of the pull-up transistor in this way, the switching speed of the output driver is significantly increased. When the output driver is in a disabled tri-state mode, the series transistors, and the switching transistor, are turned off. A first deselect transistor provides a high voltage at the drain of a load transistor to force it into cutoff. A select transistor is turned off to isolate the pull-up transistor well-tie from the output node, and a second deselect transistor is switched on to connect it to ground. This embodiment isolates the well-tie from the driver output while in tri-state to prevent latch-up initiated by multiple power supply operation.

11 Claims, 3 Drawing Sheets

OUTPUT DRIVER CIRCUIT WITH BODY BIAS CONTROL FOR MULTIPLE POWER SUPPLY OPERATION

BACKGROUND OF THE INVENTION

1. Field of the Invention

The present invention relates in general to an output driver circuit for integrated circuits and, in particular, to an output driver circuit having a controlled body bias. Still more particularly, the present invention relates to a controlled body bias output driver circuit for use in devices having multiple power supplies.

2. Description of the Prior Art

Semiconductor chips typically contain one or more outputs suitable for connection to off-chip "buses", which allow multiple devices to transfer data on a single line. Most logic gates and integrated circuit devices utilize drivers or buffers at their output when driving signals over long transfer lines such as a communication bus. An output driver is typically comprised of large transistors which are capable of furnishing drive current beyond the capacity of most of the on-chip logic gates. In order to prevent errors in communication on a bus, the chip will control the output drivers connected to the shared bus through a given handshaking protocol and addressing scheme so that only one device is communicating on the bus at any one time. Thus, when used to drive a data bus, output drivers are typically of a 3-state output arrangement. A driver with a three state output behaves like any ordinary pull-up logic driver when enabled, always driving its output either high or low. When disabled, it effectively disconnects, or "open-circuits", its output from the bus so other logic devices can drive the same line.

One traditional output driver is the "CMOS Inverter" output device. This driver comprises a PMOS transistor in series with an NMOS transistor, their gates driven by the same input signal. This driver design has been successful due to its low power consumption and high speed operation. However, under certain operating conditions, this design is susceptible to latch-up. In particular, potential latch-up problems occur when the logic gate or device utilizing the CMOS inverter driver operates in multiple power supply ranges. Multiple power supply and ground pins are commonly provided with integrated circuits to reduce operational effects induced by output noise in high performance applications.

In order to avoid the latch-up problem in a CMOS driver, a stacked NMOS output driver as seen in FIG. 1 could be used. Here, two NMOS transistors are connected in series and are supplied with complementary input signals. This configuration provides a pull-up transistor for sourcing the output up to the high rail in response to a logic high input, and a pull-down transistor for sinking the output low in response to a logic low input. Transistor M1 is biased with $V_{CCQ}$, and the gate input is signal N1out. The transistor M1 acts as a source follower to force a high signal output on the driver output DQ when turned on. Transistor M2 is placed in series with transistor M1. The input at the gate of transistor M2 is signal N0out which is the complement to N1out. Thus, in operation, when signal N1out is high, transistor M1 is turned on and transistor M2 is turned off. This sources the driver output DQ to a voltage of approximately $V_{CCQ}$. When the driver input N C1out is low, the complementary signal N0out is high. Transistor M1 is switched off and transistor M2 is switched on. This pushes the driver output DQ down to the lower rail voltage attached to the source of transistor M2, in this case ground. Because transistor M1 pulls the output high and transistor M2 pushes the output low, this type of output driver has been called a "push-pull" configuration. In the disabled state, both N1out and N0out are low, turning M1 and M2 off to effectively open circuit the connection to the output.

In a typical design for the stacked NMOS driver, the P-well of both transistors would be grounded. However, for the pull-up MOSFET, any change in the driver output voltage produces a source-substrate voltage. This in turn results in a higher threshold voltage through the body effect, resulting in a reduced switching speed. The body effect is due to the influence of the substrate acting as a second gate. This degrades performance by changing the point at which the transistor turns on, thereby slowing its switching speed. In order to avoid the body effect, the source-substrate voltage must remain at zero.

In the FIG. 1 design, both transistors have their substrate tied to their source to avoid the body effect. With this design, variations in switching speed caused by source-substrate voltage does not occur. Although this design significantly improves the slew rate of transistor M1 when turned on, having the output tied to the substrate or well-tie of transistor M1 slows the rate at which transistor M1 turns off when a low signal is placed on N1out.

Moreover, when the driver is used by a device capable of being referenced to multiple power supplies, there is a significant potential for latch-up of the driver coming from the output-tied well of transistor M1. Latching occurs when the driver is referenced to an upper rail voltage lower than the substrate voltage. This causes the inherent P-well to bulk silicon PN junction to become forward biased. With an NMOS transistor adjacent to this junction, a severe latch-up mechanism will be initiated by the PNPN structure. Such a latch-up renders the device non-operational. The negative voltage differential between the drain and substrate may occur from a transient on the output pin or an output signal from another device referenced to a higher voltage.

Therefore, it would be desirable to have a stacked NMOS output driver having an increased driver switching speed and is less susceptible to latch-up while operating in a tri-state mode on a device having multiple power supply pins.

SUMMARY OF THE INVENTION

It is therefore one object of the present invention to improve the performance of an output driver circuit through improved switching speed of the driver circuit transistors.

Another object of the invention is to improve performance of a three state output driver utilized in a multi-power supply device without introducing a latch-up mechanism.

Therefore, in accordance with the present invention, the foregoing and other objects are attained by a push-pull output driver including two transistors in series, one transistor having its body bias controlled by logic circuitry commanded by the driver input. The driver has a pair of transistors in series, the transistor inputs being complementary to create a push-pull amplifier. A switching transistor is controlled by the inverse of the driver input signal and acts as a switch at the pull-up transistor well-tie. When the driver input is high, the switching transistor is off allowing the well-tie to the pull-up transistor to be connected to the driver output. When the input is low, the switching transistor turns on, switching the well-tie of the pull-up transistor to ground. By controlling the body bias of the pull-up transistor in this way, the switching speed of the output driver is significantly increased.

In accordance with another aspect of the invention, the output driver of the present invention is capable of a three state operation without being susceptible to latch-up. When the output driver is in a disabled tri-state mode, the series transistors and the switching transistor are turned off. A first deselect transistor provides a high voltage at the drain of a load transistor to force it into cutoff. A select transistor is turned off to isolate the pull-up transistor well-tie from the output node, and a second deselect transistor is switched on to connect the well-tie to ground. This embodiment isolates the well-tie from the driver output while in tri-state to prevent latch-up initiated by multiple power supply operation.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 2:
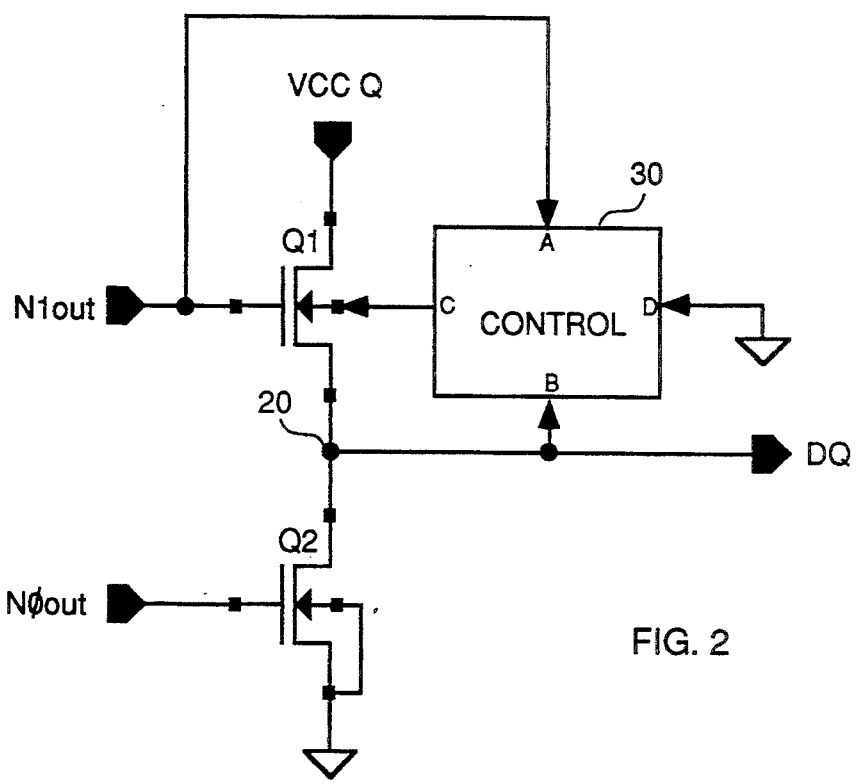
FIG. 2 is a schematic diagram of an NMOS output driver with a controlled well-tie in accordance with the present invention.

With reference now to the figures, and in particular with reference to FIG. 2, there is illustrated a schematic diagram of the NMOS output driver circuit of the present invention. The driver is designed with an output signal DQ which tracks a digital input signal N1out. Transistors Q1 and Q2 are connected in series. Transistor Q1 is powered by VCCQ at its drain terminal and transistor Q2 is connected to the low power rail at its source. In this case, the lower power rail is ground. The common node 20 between transistors Q1 and Q2 provides the output signal DQ of the output driver circuit. This node is typically connected to either an internal communication bus or an output pad to drive the signal DQ off-chip. Control 30 is used for switching the body bias of transistor Q1 between output node 20 and ground. This switching is controlled by input signal N1out.

If signal N1out is high, or a digital one, transistor Q1 will be turned on to drive output signal DQ high. Transistor Q2 will be turned off by the complementary signal N0out which is always the complement of signal N1out.

Figure 1:
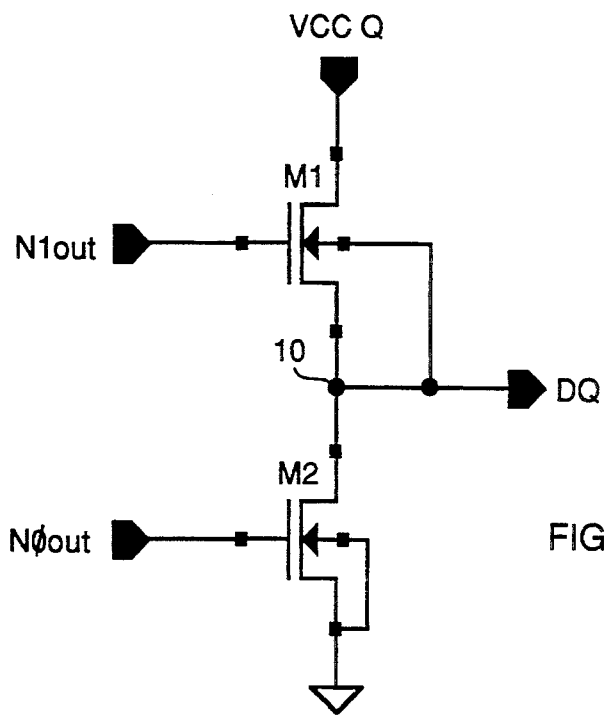
FIG. 1 is a schematic diagram of a stacked NMOS output driver used in the prior art.

The input signal to control 30, signal N1out, is shown at A. When reading a high signal at A, control 30 connects node 20 input at B to the well-tie of transistor Q1 through C. As has been described, connecting the driver output as a body bias (also known as a back-bias or a back-gate bias) to the P-Well or substrate of transistor Q1 (transistor Q1 is analogous to transistor M1 in FIG. 1) when transistor Q1 is being turned on, increases the slew rate by avoiding the body effect, and so, creates a faster response to a high input. In fact, providing such a feedback path from the output increases the speed of the output driver up to three times that of a non-biased P-well driver.

When the signal N1out changes to a low value, transistor Q1 is turned off. The complementary signal N0out is high, so transistor Q2 is turned on. This pulls node 20 down to ground. The rate at which node 20, and therefore output signal DQ, is brought to a low level is dependent on the speed at which transistor Q1 is turned off. A low signal N1out at A causes control 30 to switch the body bias connection of transistor Q1 at C to ground at D. A large source-substrate bias is now imposed. This increases the threshold voltage and accelerates the rate at which transistor M1 turns off. Furthermore, the capacitive load on transistor Q2 is reduced. Consequently, the driver is capable of switching from a high output to a low output faster.

In summary, control 30 switches the body bias to the P-Well of transistor Q1 between transistor Q1's source and ground in order to optimize the speed at which transistor Q1 changes state. When transistor Q1 is turned on to pull the output node 20 high, the output signal DQ is applied as a body bias in order to achieve the fastest slew rate. When transistor Q1 is turned off, control 30 applies ground as the body bias thereby speeding the rate at which the output discharges. This can be a significant increase considering that the P-Well area can be as high as 25,000 square microns, creating a large capacitive load.

Figure 3:
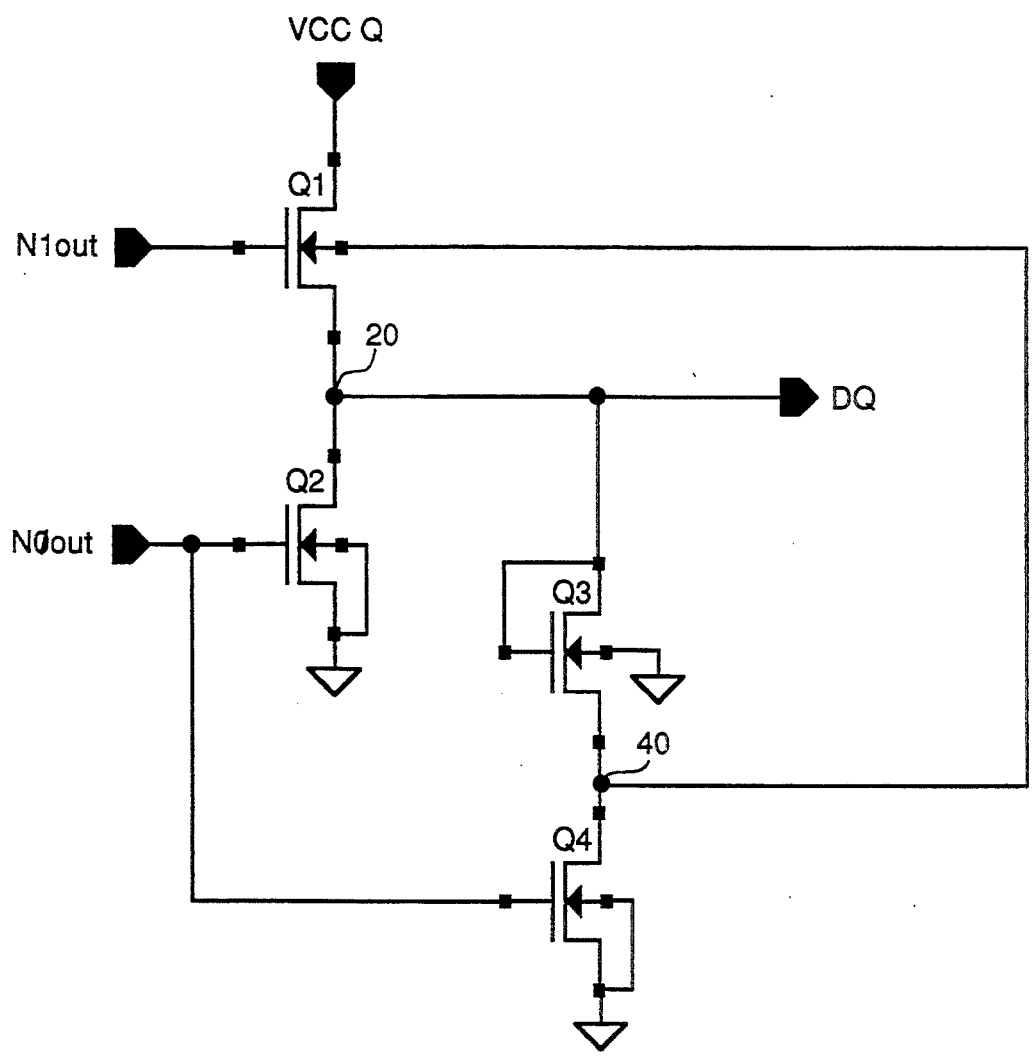
FIG. 3 is a schematic diagram of an NMOS output driver with a controlled well-tie as described in a preferred embodiment of the present invention.

Referring next to FIG. 3 which schematically shows one embodiment of the present invention, control 30 as shown in FIG. 2 is implemented using transistors Q3 and Q4. Transistors Q1 and Q2 are configured as in FIG. 2. Transistor Q3 has both its drain and gate tied to node 20 to act as a non-linear active load. Transistor Q4 is connected to transistor Q3 in series at node 40. Transistor Q4's gate input is the complementary signal N0out. In operation, when signal N1out is high, transistor Q1 is turned on. Signal N0out is low, and so transistor Q2 and transistor Q4 are turned off. As the voltage at output node 20 begins to rise, the bias passes through load transistor Q3 and is applied at the P-Well of transistor Q1 as a body bias. When input signal N1out is low and transistor Q1 is turned off, complementary signal N0out is high, turning on transistor Q2 and transistor Q4. Thus, as node 20 goes to ground through transistor Q2, the back-gate-bias applied to the P-Well well-tie of transistor Q1 is also forced to ground at node 40 through transistor Q4.

If the embodiment of the present invention as described for FIG. 3 is utilized as a tri-state bus driver for a device having multiple power pins, there is a potential for the output driver to latch-up. Typically, when the output driver is in a tri-state or open circuit mode, another device will be driving its output signal on the bus. The device driving the bus may be sending a high signal powered by a standard voltage (for example, 5 volts). The output driver of FIG. 3 being of a multiple power pin configuration may at that time be powered by a lower level voltage (for example, 3.3 volts). To implement the tri-state, transistor Q1, transistor Q2, and transistor Q4 are turned off. However, the load transistor Q3 still remains a load at node 20. Therefore, if node 20 is attached to a bus, transistor Q3 remains an active load on that bus and continues to connect the P-Well of transistor Q 1 to the bus. Consequently, the high voltage on the bus is applied to the P-Well. With the lower level power supply connected to the N-doped drain of Q1, a forward-bias (5V to 3.3V) PN junction is created within the transistor. With NMOS transistor Q2 nearby, a severe latch-up may be initiated in the series PNPN junctions.

Figure 4:
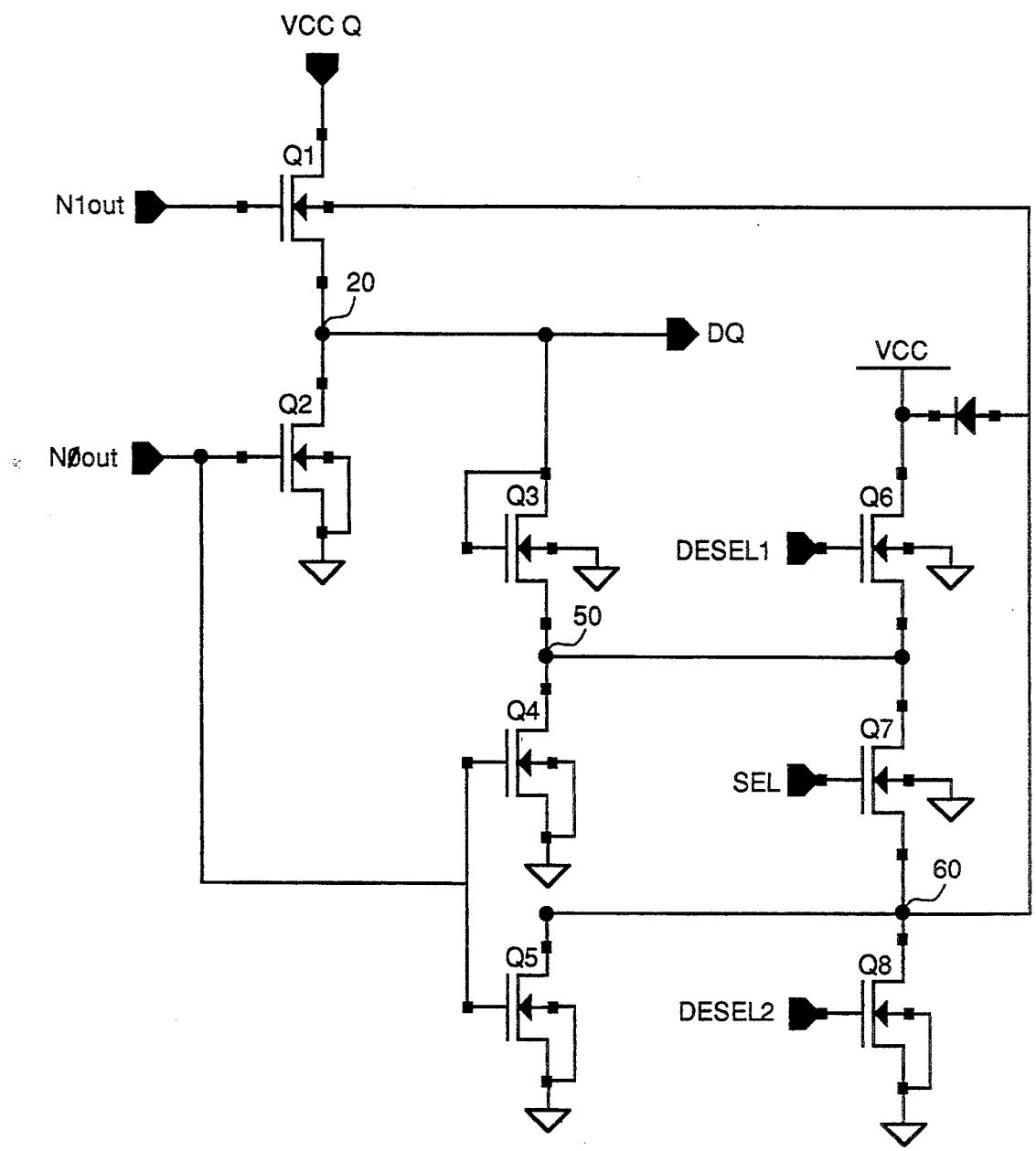
FIG. 4 is a schematic diagram of a three state NMOS output driver with a controlled well-tie as described in a preferred embodiment of the present invention.

Referring now to FIG. 4, there is depicted a schematic diagram of an output driver according to another embodiment of the present invention. This embodiment allows control of the body bias based on the inputs to the output driver, but it has the additional feature of enabling the output driver to operate as a tri-state output driver on a device having multiple power supply pins without being susceptible to latch-up.

The operation of the second embodiment of the present invention can best be understood by its operation in each of the operating modes. The first mode is when the output driver is driving the output signal DQ high. Transistor Q1 is turned on by signal N1out, and transistors Q2, Q4 and Q5 are turned off by complementary signal N0out. Signal DESEL1 and signal DESEL2 indicate that the driver has been deselected and should be placed in tri-state when set high. When they are set low, transistors Q6 and Q8 will be turned off. Signal SEL, which indicates that the driver is selected to output on the bus, is high, turning on transistor Q7. Thus, during a high signal DQ, node 20 is connected as a body bias to transistor Q1 through load transistor Q3 and switch transistor Q7.

When the output driver is driving the output signal DQ low, transistor Q1 is turned off; transistors Q2, Q4, and Q5 are all turned on. With Transistors Q6 and Q8 remaining off and transistor Q7 remaining on because the driver is still selected, nodes 50 and 60 are forced to ground.

In order to place the output driver in the open circuit tri-state mode, the output driver is deselected such that its output and the Q1 P-well tie are removed from the bus. This is accomplished as follows. Signal N1out and complementary signal N0out are both set low. This turns off transistors Q1 and Q2 isolating the output node. DESEL1 and DESEL2 are set high, turning on transistors Q6 and Q8. Signal SEL is set low, turning off transistor Q7. With transistors Q4 and Q5 turned off, transistor Q8 pulls node 60 to ground to stabilize the body bias of transistor Q1. Transistor Q7 isolates node 50 from the body bias attached to node 60. With transistor Q6 on, node 50 is forced to approximately VCC which is the highest power level of the multiple power supply device. This insures that regardless of the signals sent on the bus at node 20, transistor Q3 will remain in its cutoff region, isolating node 50 from node 20.

In this way, the output driver of the present invention provides control of the body bias applied to the pull-up transistor of the stacked NMOS amplifier, thereby improving pull-up and pull-down slew rates. Moreover, the control has the additional feature of preventing a possible latch-up mechanism from occurring when the output driver is utilized with a device having multiple power supplies by effectively isolating the output driver from the output pin of the chip.

It will be appreciated by those skilled in the art that the output driver of the present invention, as described in the preferred embodiments, may be used with additional circuitry not shown in the figures for implementing other features of known output drivers. For example, it is common for a protection circuit to be placed in the output driver in order to protect the device from Electro-Static Discharge. Also, it will be appreciated by those skilled in the art that FIG. 2 shows the most general case of a control circuit controlled by the driver input signal. FIG. 3 shows a preferred embodiment where the control circuitry has an input of the complement to the input signal. This illustrates that the present invention is not limited to only the driver input as a control signal but that it may be implemented using a derivative signal of the driver input as a control signal. It will also be appreciated by those skilled in the art that the output buffers of FIGS. 2, 3, and 4 may be implemented using PMOS technology. A PMOS technology embodiment of the present invention would be analogous to the NMOS output buffers of the preferred embodiments as described herein above, as will be appreciated by those skill in the art.

While the invention has been particularly shown and described with reference to two preferred embodiments, it will be understood by those skilled in the art that various changes in form and detail may be made therein without departing from the spirit and scope of the invention.

What is claimed is:

1. An output driver circuit, comprising:
   a first transistor having a first input signal applied as an input, and formed in an isolated well substrate and a well-tie being attached to the substrate;
   a second transistor in series with the first transistor having a second input signal applied as an input, the common node between the transistor connected to an output node; and
   a control circuit for applying a back-bias to the well-tie, the control circuit connecting the well-tie to a selected voltage as a function of the first input signal.

2. The output driver circuit of claim 1, wherein the control circuit connects the well-tie of the first transistor to the driver output node when the first input signal is a logic high signal, and to a low rail voltage when the first input signal is a logic low signal.

3. The output driver circuit of claim 1, wherein the first and second transistors are N-MOSFETs.

4. The output driver circuit of claim 3, wherein the control circuit comprises;
   a third N-MOSFET connected between the driver output and the first transistor well-tie such that the third N-MOSFET acts as an active load on the driver output;
   a fourth N-MOSFET, controlled by the second input signal, connected between the first transistor well-tie and a low voltage rail, wherein a high second input signal connects the well-tie to the low voltage rail.

5. An output driver circuit of claim 1, wherein the control circuit connects the well-tie to a selected voltage as a function of the first and second input signals.

6. The output driver circuit of claim 5, wherein the control circuit connects the well-tie to:

the driver output when the first input signal is a logic high signal and the second input signal is a logic low;

a low voltage rail when the first input signal is a logic low signal and the second input signal is a logic high; and a low voltage rail when the first and second input signals are both a logic low.

7. The output driver circuit of claim 6, wherein the first and second transistors are N-MOSFETs, and further comprising, within the control circuit:

a third transistor having a gate and drain connected to the driver output node;

a fourth transistor connected in series with the third transistor creating a common node between them and having an input of the second input signal;

a fifth transistor having an input of the second input signal and being connected between the well-tie and ground;

a sixth transistor having a deselect input signal connected between a high voltage source and the common node between the third and fourth transistors;

a seventh transistor having a select input signal connected between the node common to the third and fourth transistors and the well-tie; and an eighth transistor having an input of the deselect signal connected between the well-tie and ground.

8. A three state output driver circuit, comprising:

a first transistor having a first input signal applied as an input, and formed in an isolated well substrate and a well-tie being attached to the substrate;

a second transistor in series with the first transistor having a second input signal applied as an input, the common node between the first and second transistors connected to an output node;

a third transistor having a gate and drain connected to the driver output node;

a fourth transistor connected in series with the third transistor creating a common node between them and having an input of the second input signal;

a fifth transistor having an input of the second input signal and being connected between the well-tie and ground;

a sixth transistor having a deselect input signal connected between a high voltage source and the common node between the third and fourth transistors;

a seventh transistor having a select input signal connected between the node common to the third and fourth transistors and the well-tie; and an eighth transistor having an input of the deselect signal connected between the well-tie and ground.

9. A three state output driver circuit according to claim 8, wherein the transistors are N-MOSFETs.

10. A method for improving performance of a semiconductor output driver including a first transistor having a first input signal applied as an input, a well-tie being attached to the substrate, a second transistor in series with the first transistor the common node between the transistors connected to an output node, the method comprising the steps of:

sensing the input signal;

switching the well-tie to connect it to the driver output node when the input signal is high; and switching the well-tie to connect it to ground when the input signal is low.

11. The method for improving performance of a semiconductor output driver of claim 10, wherein the output driver is capable of a three state operation, further comprising the step of switching the well-tie connection to ground when the output driver is placed in a tri-state mode.

* * * * *